(12) United States Patent
Maciossek (10) Patent No.: US 6,383,357 B1
(45) Date of Patent: *May 7, 2002

(54) PRODUCTION OF BEVELLED GALVANIC STRUCTURES

(75) Inventor: Andreas Maciossek, Berlin (DE)

(73) Assignee: Fraunhofer-Gesellschaft zur Forderung der Angewandten Forschung, E.V., Munich (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/117,619
(22) PCT Filed: Feb. 6, 1997
(86) PCT No.: PCT/DE97/00226
§ 371 Date: Dec. 29, 1998
§ 102(e) Date: Dec. 29, 1998
(87) PCT Pub. No.: WO97/29222
PCT Pub. Date: Aug. 14, 1997

(30) Foreign Application Priority Data

Feb. 6, 1996 (DE) .......................... 196 04 242

(51) Int. Cl.[7] ................................................ C25D 1/00
(52) U.S. Cl. ...................... 205/136; 205/67; 205/71; 205/118; 205/159; 205/183; 205/184
(58) Field of Search ................... 205/50, 118, 122, 205/123, 67, 70, 75, 114, 71, 136, 159, 183, 184

(56) References Cited

U.S. PATENT DOCUMENTS 5,443,713 A * 8/1995 Hindman ...................... 205/70
5,512,161 A * 4/1996 Dinglreiter ................... 205/67

FOREIGN PATENT DOCUMENTS

WO    WO 94/06952    3/1994

OTHER PUBLICATIONS

B. Wagner, H.J. Quenzer, W. Henke, W. Hoppe, W. Pilz; Sensors and Actuators, A 46–47 (1995) 89–94; Fraunhofer–Institute for Silicon Technology, Berlin Germany.

* cited by examiner

Primary Examiner—Kathryn Gorgos
Assistant Examiner—William T. Leader
(74) Attorney, Agent, or Firm—Duane Morris LLP (57) ABSTRACT

A three-dimensional formed metallic structure with varying thickness including sloping flanks is formed on a substrate. A conductive layer is applied to the substrate initially, in the form of laterally spaced electrically isolated conductive islands. A cathodic potential is connected to at least one of the islands, leaving others unconnected, and deposition proceeds due to the cathodic potential. As metallic material is deposited and builds up, it eventually contacts adjacent islands, thereby coupling the cathodic potential to a wider area where deposition commences. Deposition is thickest at the at least one island initially coupled to the cathodic potential and thinner progressing away, forming flanks that are linearly sloped, curved or similarly formed by thickness variations the vary proceeding away from the initially coupled island or islands.

28 Claims, 7 Drawing Sheets

PRODUCTION OF BEVELLED GALVANIC STRUCTURES

BACKGROUND OF THE INVENTION AND FIELD OF THE INVENTION

The technical field of the invention is the manufacturing of three-dimensionally shapable galvanic structures on substrates, having their possibilities and limitations according to prior art by structuring with a photosensitive resist and subsequent galvanic deposition.

PRIOR ART

Prior art describes the forming of galvanic structures, which are electrically conductive and find an extensive field of application in micromechanics, by coating with a photosensitive resist, by exposing and removing of certain parts of the applied resist and subsequent galvanic deposition from a galvanic fluid which is switched to a first potential, whereas the electrically conductive basis on the substrate as plating base is switched to an opposite potential. Galvanic structures obtained by said method generally have edge portions extending in vertical direction, as the incident light on the photosensitive resist always is perpendicular, so that only perpendicular resist structures can develop. Thus, only such galvanic structures may be provided, the flanks of which extend in the direction the inciding light had.

SUMMARY OF THE INVENTION

The object of the invention is to give up resist structures predetermined by the inciding light as a pattern for galvanic structures and to provide the possibility of obtaining freely shapable galvanic structures the side surfaces (flanks) of which no longer being forced to extend in vertical or substantially vertical direction. The solutions proposed by the present invention are specified according to the invention disclosed.

Accordingly, structures which are shapable in vertical direction and galvanically deposited are provided as profiles on a substrate by structuring a conductive layer, which is applied before, in lateral direction. Said three-dimensionally shapable metallic structure provided by a galvanization method is also obtained if the substrate is provided with at least one conductive layer, one of said number of or the one conductive layer is structured in lateral direction by forming a number of island areas having no or no substantial conduction with respect to each other, and during galvanization, one of said island areas is provided as a core area and switched to a cathodic potential. The result obtained by said manufacturing method steps disclosed herein.

On the basis of the product obtained by said method, which product is a three-dimensionally shaped solid metallic structure with a more than distinct extension in vertical direction ("profile"), it may be recognized that no longer all vertical side surfaces of said structure are forced to extend in vertical or substantially vertical direction. However, this does not mean that all sides are compelled to have a beveled or curved extension, but only that at least one of the vertical flanks is a beveled or curved surface which could not be shaped by using a known manufacturing method. The "profile" according to the present invention is not a surface in the form of a laterally deposited layer.

Certainly, a photosensitive resist is still used, however, it is no longer the core and the basis for a galvanic deposition on the basis of exposed and etched guiding structures based on a photosensitive resist layer. According to the invention, said resist is used for shaping a three-dimensional structure in vertical direction by covering a major part of the core area and leaving only a small section free, thus permitting a cathodic potential to pass over into the galvanic bath. Starting from said potential in the galvanic fluid, a slowly growing layer is formed on said small section with cathodic potential. Said layer grows in vertical direction thereby also being forced to slightly enlarge in lateral direction.

As the invention provides further island areas, which are spaced in lateral direction, as second areas which are obtained from the plating base after their structuring, which plating base was at first deposited as a continuous conductive layer, an over-galvanization over isolated areas from the cathodic area to the subsequent structured area which is spaced apart therefrom and again electrically conductive but not switched to the cathodic potential. Said manner of controlling the over-galvanization in lateral direction permits to define the beveled surface dependent on the interspace and the width of said electrically not connected island areas, said beveled surface being obtained by a longer or shorter galvanization time.

Each respective front of said beveled surface growing in lateral direction—which is the growing profile—always grows discontinuously (stepwise) when reaching as an electrically conductive layer the subsequent conducting island. The subsequent expansion in lateral direction is much faster than when just reaching the end of said island area in lateral direction. Controlled by the stepwise lateral expansion and the substantial growth of the conducting structure thereby obtained, a solid structure of any shape may be provided on the substrate which structures so far could not be obtained by coating with resist, uncovering and usual galvanization methods.

In short words, the new method permits to control the lateral growth rate by determining the length and duration of the galvanization process on the one hand and—before starting the galvanization process—by applying defined geometric shapes as structures to the plating base subjected to the galvanic bath during galvanization.

The galvanic profile results from the ratio of the lateral growth rate with respect to the vertical growth rate.

The galvanic structures may be selected to comprise one of gold and nickel. The electrically conductive starting layer (plating base) may comprise the same materials. If a number of plating bases is used, they are isolated by intermediate layers, preferably SiN layers. If only one plating base is used, the substrate itself may have isolating function, not requiring an additional isolating layer to be provided on the substrate.

If the manufacturing method according to the invention does not use thick resist layers, no lateral frame is formed for those vertical surfaces which are not intended to be beveled. In this case, it is possible to let the beveled galvanic structure grow in all directions, e. g. in circular or ellipsoidal form. If concentric island areas are used for controlling the lateral growth speed, also concave or convex profiles may be obtained having a substantially unlimited height h.

If a thick resist structure is used, a free growth rate in lateral direction, defined by a stepped over-galvanization may only develop in those areas where the structured photosensitive resist does not define a limit. In the areas being provided with a thick resist layer, the growth rate is limited, the galvanic deposition being provided only in a direction where no limitation by resist is defined.

The coating with thick resist structures may advantageously be combined with a completely free plating base structure, so that in certain areas, the growth rate in lateral direction (x- and y-direction) is limited and localized, however, in another direction it is predetermined due to the structured plating base.

The inventive method is very inexpensive, particularly with respect to a known gray-tone lithographic method, this technology being based on reducing the size of the structures in the mask design in relation to the lithographic resolution. Thus, gray-tone lithography does no longer provide bright/dark areas but a mixture of gray tones which, however, may only be achieved by using a very complex mask design requiring an optical reduction device for exposure (compare "Microfabrication of complex surface topographies" in Sensors and Actuators, A 46–47, pages 89–94, 1995). In contrast to a gray-tone lithographic method which at first provides a three-dimensional resist profile, subsequently being coated with a thin metallic layer to permit a galvanic deposition, the method according to the present invention provides solid galvanic structures without resist layers positioned thereunder and without using exposure stepper devices, but only applying simple and wide-spread UV contact exposure devices. Said devices are considerably less expensive and thus the results obtained with them are also less expensive.

If, according to the present invention, x-ray lithographic methods (LIGA technique) are used for structuring the thick resist, three-dimensional structures of a height of several 100 $\mu$m may be obtained. If a UV photosensitive resist and contact exposure devices are used, the height of the thick (structured) resist layer is limited to about 100 $\mu$m due to the maximum exposure depth of said method. The limit thus provided only applies for manufacturing methods using thick photosensitive resists, those inventive manufacturing methods which work without resist limits as edge areas of the galvanic are not restricted in their height by said exposure depth, the height depending solely on the period of time during which galvanic deposition is effected.

BRIEF DESCRIPTION OF THE DRAWINGS

In the following, the invention(s) are described in detail on the basis of several embodiments.

FIG. 8$a$ to FIG. 8$e$ show an alternative embodiment of a galvanic method for manufacturing a beveled structure, according to that of FIG. 7, wherein two conductive layers applied one onto the other are separated by an isolating layer 13$b$, a window 13$b$' uncovering a part 23$_k$ of said first conductive layer 23 to obtain a growth rate controlled in lateral direction together with an island area 22$_i$ formed from the second conductive layer 21. FIG. 8$e$ schematically indicates an electrical connection (+) and (−) as well as n.c., said positive potential (+) being applied to the galvanic fluid GF and said negative potential (−) to said plating base 23 which is positioned at a lower level and said island areas 22$_i$ being electrically not connected (not connected).

FIG. 9 is a lateral sectional view illustrating the laterally controlled growth of the galvanic substance G, dependent on a core area 11$k$ and island areas 12$_1$,12$_2$ . . . 12$_i$ which are spaced apart therefrom and electrically isolated with respect to said core area 11$k$ by said substrate 10 or by an additional isolating layer 13$a$.

FIG. 10 and FIG. 10$a$ illustrate a setting of the developing beveled structure, whereby the inclination angle is marked on the Y-axis with respect to the ratio of the island length I and the intermediate distance s. The smaller the width of each island (line) in direction of the x-axis and the larger the interspace between two islands (space), the steeper the inclination angle of the structure formed by galvanization.

FIG. 11$a$ and FIG. 11$b$ show nickel and gold galvanic structures with beveled surfaces 20',20$a$ on a structured substrate comprising stripes isolated with respect to each other which form the above indicated island area. One stripe 11$_k$ is prolonged with respect to the other stripes and serves as core area for a cathodic potential.

DETAILED DESCRIPTION OF PREFERRED EMBODIMENTS

Figure 12:
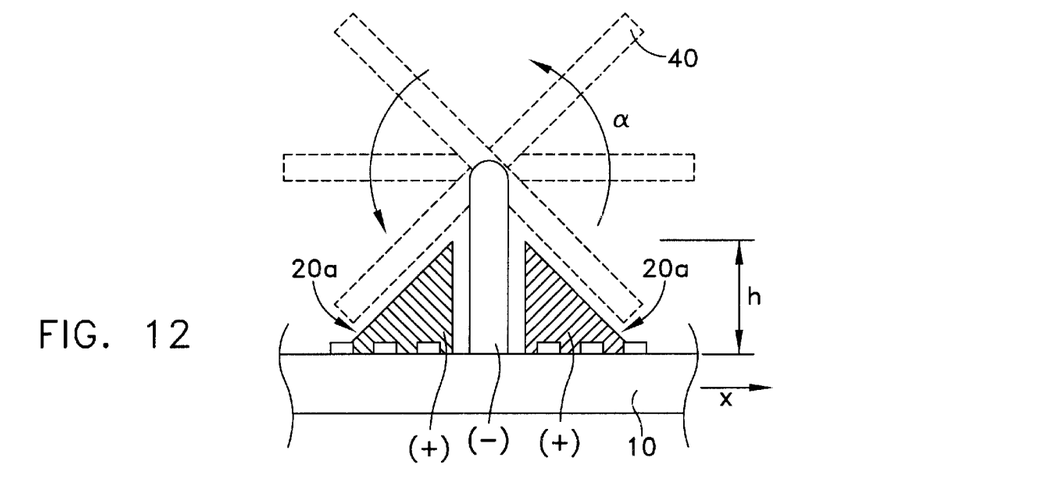
FIG. 12 shows a tilting mirror 40 as a field of application of the beveled galvanic structure, a pivot position $\alpha$(alpha) of said mirror being changed by using beveled structures, whereby lower voltages are required to achieve a larger tilting angle with respect to the embodiment according to FIG. 13, showing a tilting mirror 30 with flat galvanic structures.
Figure 13:
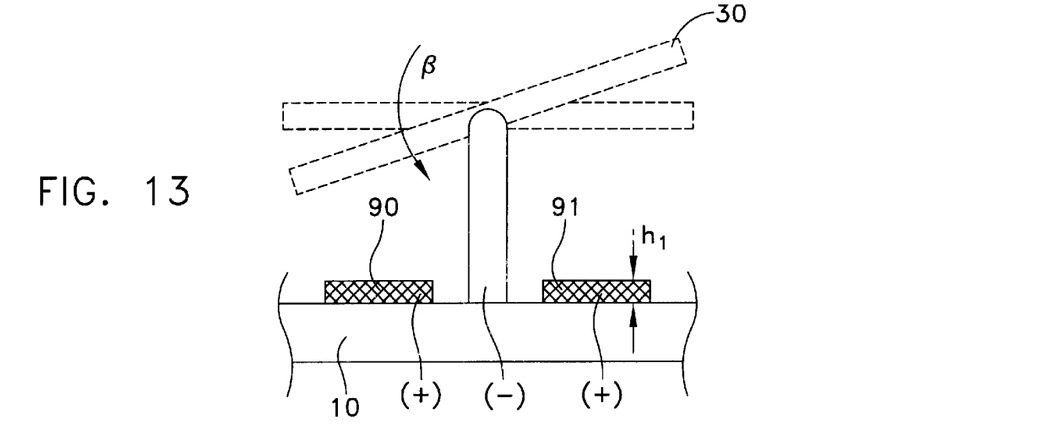
FIG. 13 shows a tilting mirror 30 with flat galvanic structures 91,90 having a small bevel angle $\beta$(beta) only—at equal control voltage.
Figure 14:
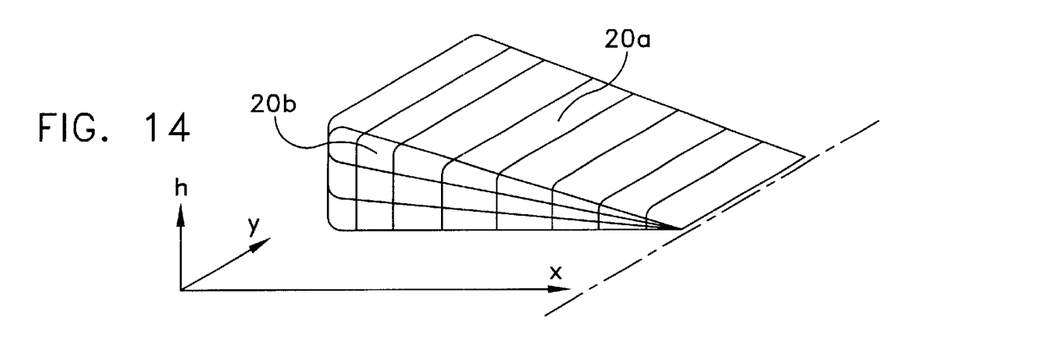
FIG. 14 illustrates an beveled structure 20$a$ growing in two plane directions x,y, the edge areas 20$b$ of said structure not extending perpendicularly with respect to the substrate 10, but forming a markedly curved side surface of the kind of a 1-e-function.

Subject to the field of application, a beveled structure on a substrate 10 is used in micromechanics (compare FIG. 12). There, a desired pivoting movement $\alpha$(alpha) of a tilting mirror 40 which is positioned on a peg is considerably enlarged, whereby the electrostatic potentials (+) and (−) are smaller, if structures are used which approach the pivoting movement, such as wedge-shaped beveled structures 20$a$ having a height h on the left and right side of the tilting mirror stator. In contrast thereto, FIG. 13 shows that a pivoting movement β(beta) of a tilting mirror 30 as illustrated there is only small when using equal potentials, if flat galvanic structures 90,91 being of considerably less height $h_1$ are used. If said galvanic structures 90,91 are thicker, the pivoting movement of the mirror is limited although smaller potentials may be used. If said galvanic structure 90,91 remains thin, a considerably higher voltage must be applied for a required pivot angle to generate comparable forces.

Figure 1:
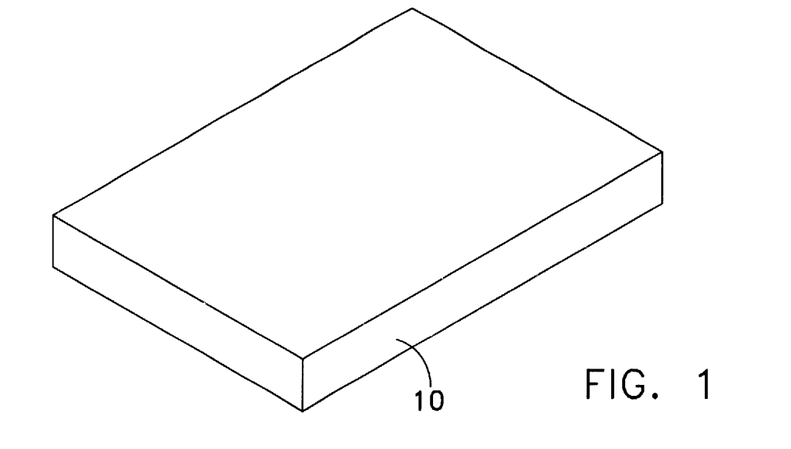
FIG. 1 illustrates a substrate 10.
Figure 2:
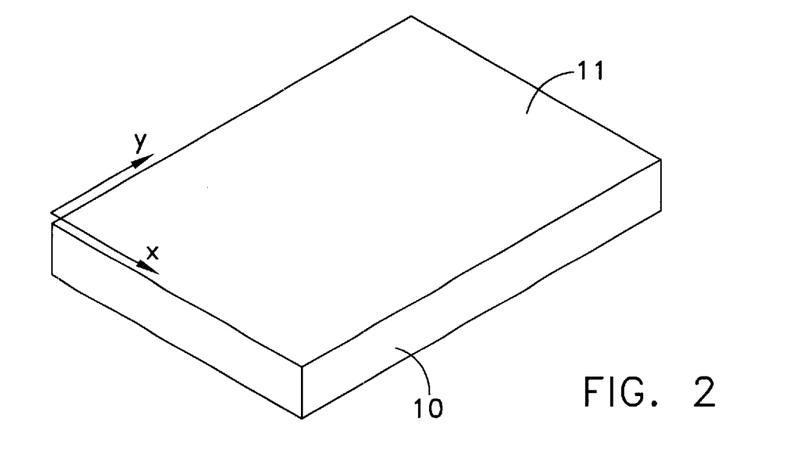
FIG. 2 illustrates the step according to which a conductive starting layer (plating base) 11 has been applied to said substrate 10.

The beveled structure which was specified on the basis of its intended application is obtained by a method which is described according to FIGS. 1 to 7 or FIGS. 8a to 8e on the basis of each respective intermediate product obtained as a result of each step of the method. First, an electrically conductive starting layer 11 is applied on a substrate 10 which in this embodiment is non-conductive (FIG. 2). The metal ions of a galvanic solution GF providing a galvanic structure discharge at said starting layer. In contrast to prior art, the presence of a structured photosensitive resist on the plating base is not necessarily required, but the plating base 11 itself is structured in the x-y-plane to provide conductive island areas $12_i$, which in this embodiment are formed as lines $12_8, 12_9, 12_{10}$ in a window left free by a core area of said plating base 11. An isolating stripe 13a extends circumferentially around the line structure of the structured island area $12_i$, said stripe separating and isolating said core area $11_k$ from said island area $12_i$. In the present embodiment, the stripe 13a is the surface of the isolating substrate 10. If the substrate 10 itself is not isolating, 13a would be a section of an intermediate isolating layer between the plating base 11 according to FIG. 2 and a conductive substrate 10.

The term "isolating" is defined such that no substantial conduction of electric current is permitted, a slight leakage current which does not substantially lead to a strongly negative potential on the islands $12_i$ not having detrimental effect.

Figure 3:
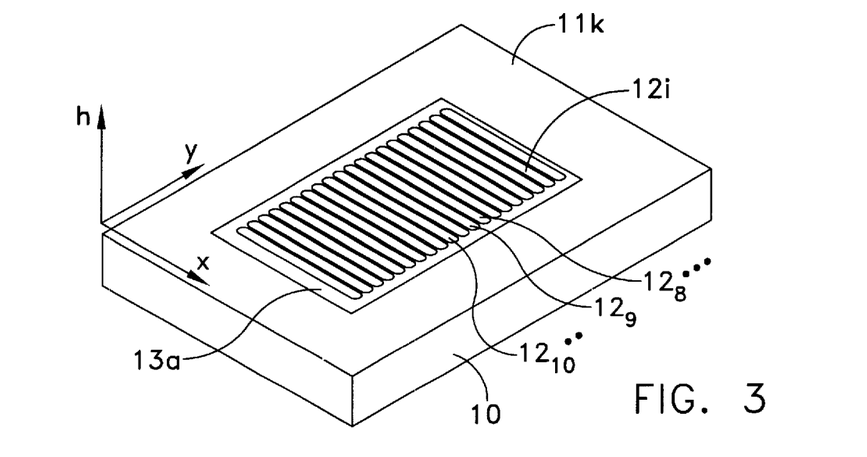
FIG. 3 shows the lateral structuring of said plating base by providing a core area 11$k$ and an island area 12$_i$ comprising a multitude of islands all of them being isolated in relation to each other. The corresponding isolating ring 13$a$ being positioned at the inside of the window left by said core area, in which the individual isolated island areas 12$_i$ are disposed as line-shaped stripes 12$_8$,12$_9$,12$_{10}$ . . . spaced apart with respect to each other without having electric contact to said core area 11$_k$.
Figures 4, 5:
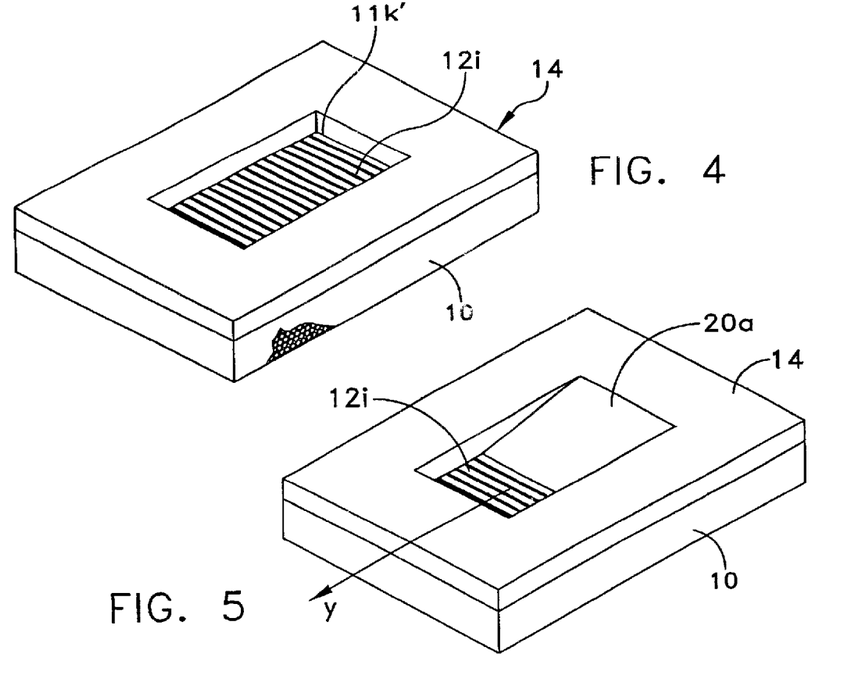
FIG. 4 is an embodiment of the inventive method and illustrates the application of a thick resist layer 14 on said core area 11$_k$, leaving free said island area 12$_i$ with the structured plating base. The right parallelepiped resist layer 14 with its window may be provided in a number of steps by coating with resist and lithography.
FIG. 5 shows the result of the galvanic deposition providing a beveled surface 20$a$ formed inside the window according to FIG. 4, if said core area 11$_k$ is switched to a cathodic potential and said island areas 12$_i$ are electrically not connected (n.c.).

A thick layer 14 of a photosensitive resist is applied on the core area $11_k$ of FIG. 3, said thick resist layer 14 being partly (in the window) exposed to light and providing the product according to FIG. 4. The conductive core 11k of said plating base 11 can still be seen on a small part stripe 11k', the remaining core area being covered by said resist layer 14. Consequently, the structured plating base area $12_i$, having a multitude of stripe-shaped islands, remains uncovered.

If between FIGS. 4 and 5 a galvanic bath GF is provided above said window and above said resist layer 14 and said core area 11k is switched to a cathodic potential, whereas said galvanic fluid GF is switched to an anodic potential, a bevelled surface 20a develops in the window after a eriod of galvanic deposition, starting from the free stripe 11k' of the cathode electrode, a controlled growth over the electrically isolated stripes taking place, limited by the remaining three vertical flanks of the thick resist 14.

Figures 6, 7:
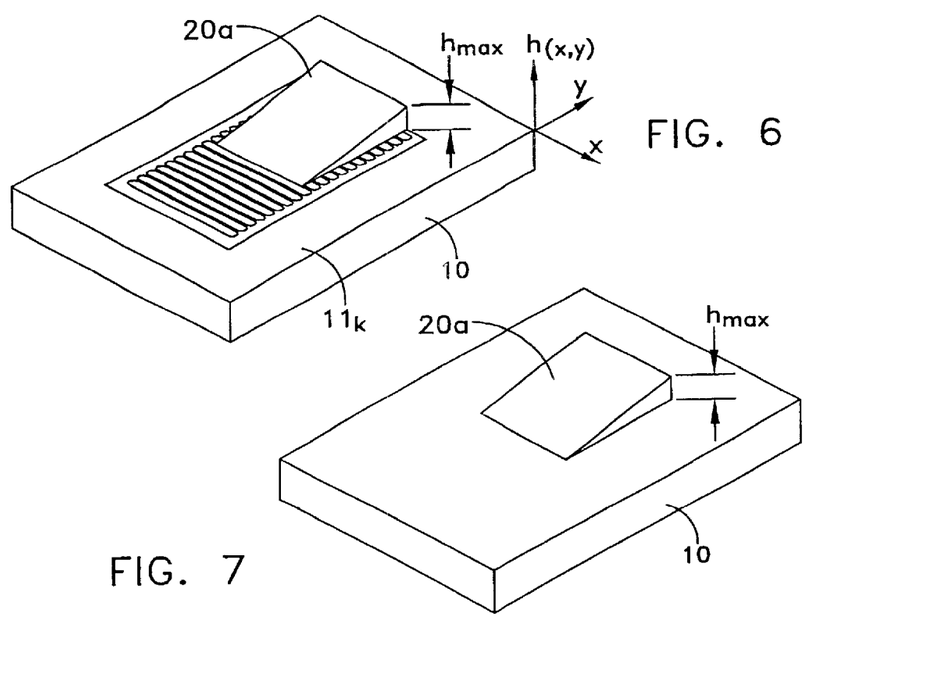
FIG. 6 shows the result obtained by the method after removing said resist layer 14, the above-described plating base 11$_k$ still remaining (on the substrate) and said beveled surface 20$a$ substantially protruding from said substrate 10 at a height h$_{max}$.
FIG. 7 illustrates the result obtained by the method after removing said core area 11$_k$ of said plating base, whereby the structured part 12$_i$ of the plating base may also be removed.

The galvanic shaping process starts at 11k' and from there, the galvanic structure 20a grows in a growing direction –y, if the coordinate system y,x,h (y,x) according to FIG. 6 and FIG. 3 is used as basis. The growth in said growing direction –y is controlled by the interspace, width and geometry of the isolated metal stripes which are defined before the beginning of the galvanic bath. The galvanic material also grows in perpendicular direction with respect to the plane of said substrate 10 and is limited in three lateral directions by said resist. In the direction not limited by said resist 14, a continuous growth in –y and h direction takes place by an over-galvanization from island to island.

Figures 9, 10, 10A:
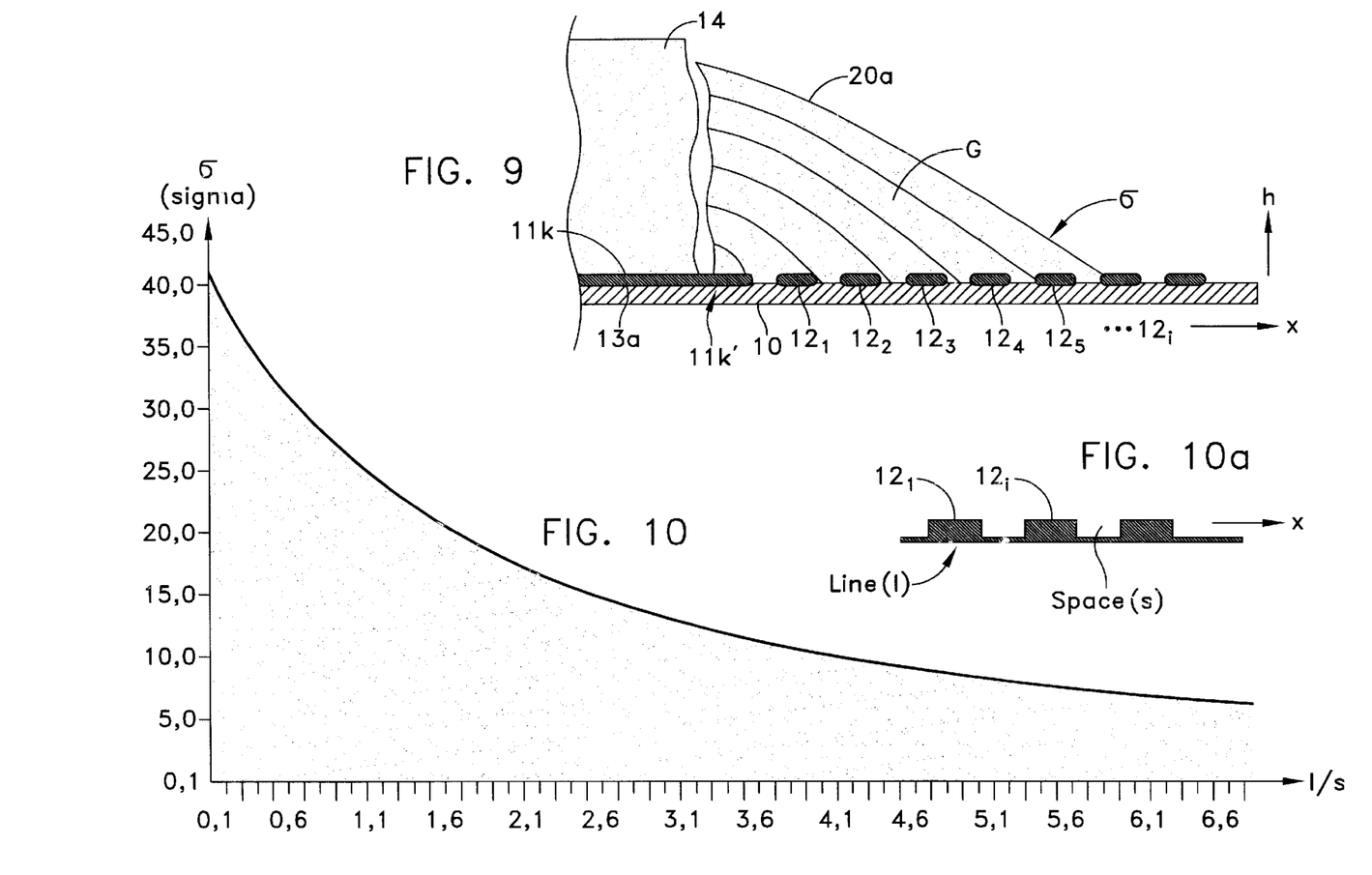

Said island areas themselves being electrically not connected, the galvanic structure first grows in vertical direction, only slowly passing said isolated intermediate area, until it reaches the subsequent island area. This is illustrated in FIG. 9 which may be regarded in connection with FIG. 5 to explain the step-wise over-galvanization over said isolated areas between said islands $12_1, 12_2, 12_3$, etc. As soon as an island area is reached by said deposited galvanic substance G, the speed of lateral growth increases stepwise and the speed of vertical growth decreases for a moment. At the end of said island area, the speed of lateral growth decreases again and the speed of vertical growth increases. Thus, the galvanization of an area in lateral direction is effected hand in hand and alternating with a growth in vertical direction. As a result of this method, a bevelled structure 20a is obtained which by applying further method steps according to FIG. 6 and 7 may remain isolated on said substrate 10, when removing said resist layer 14 (FIG. 6) and the remaining core area 11k of said plating base is also removed (FIG. 7).

Figure 11A:
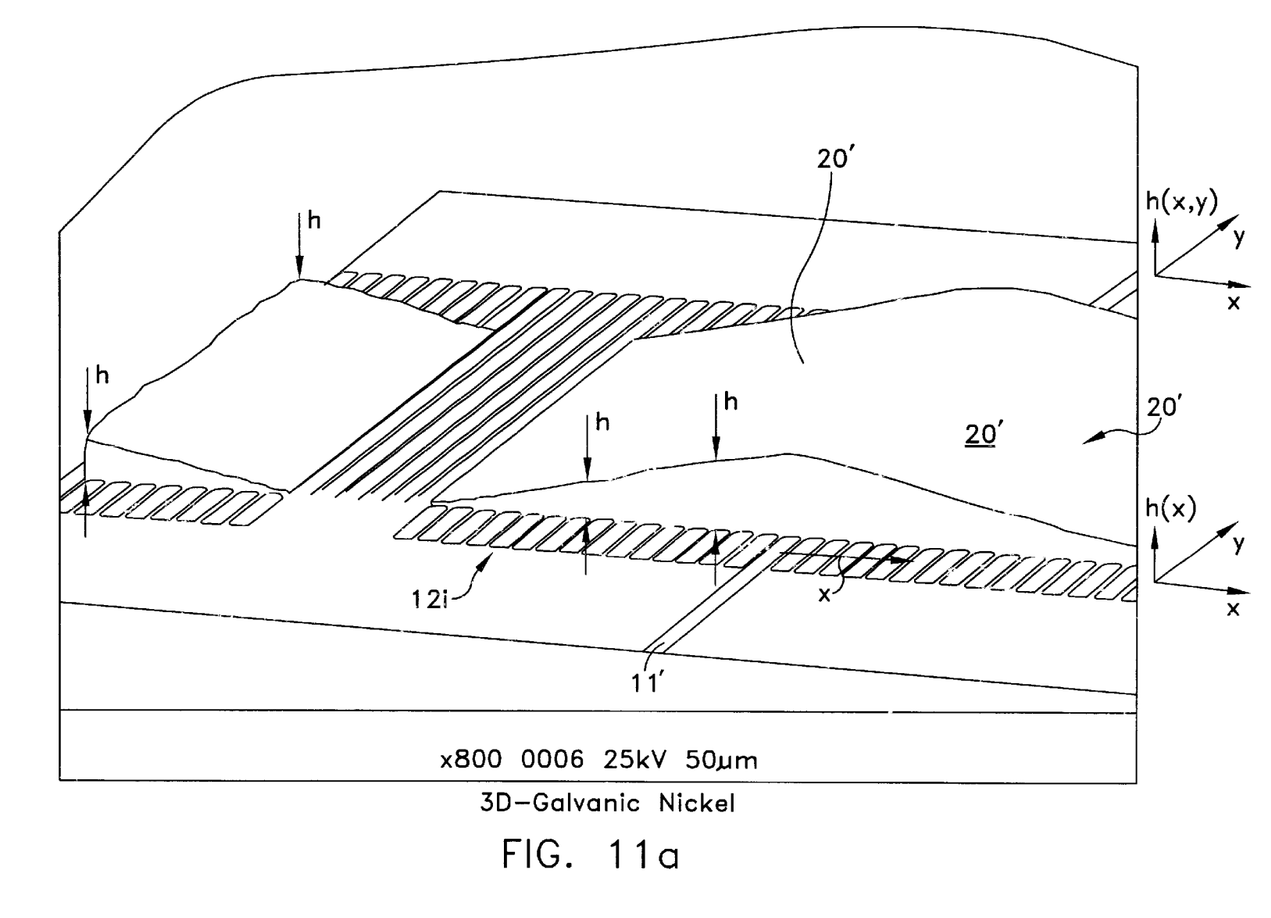
Figure 11B:
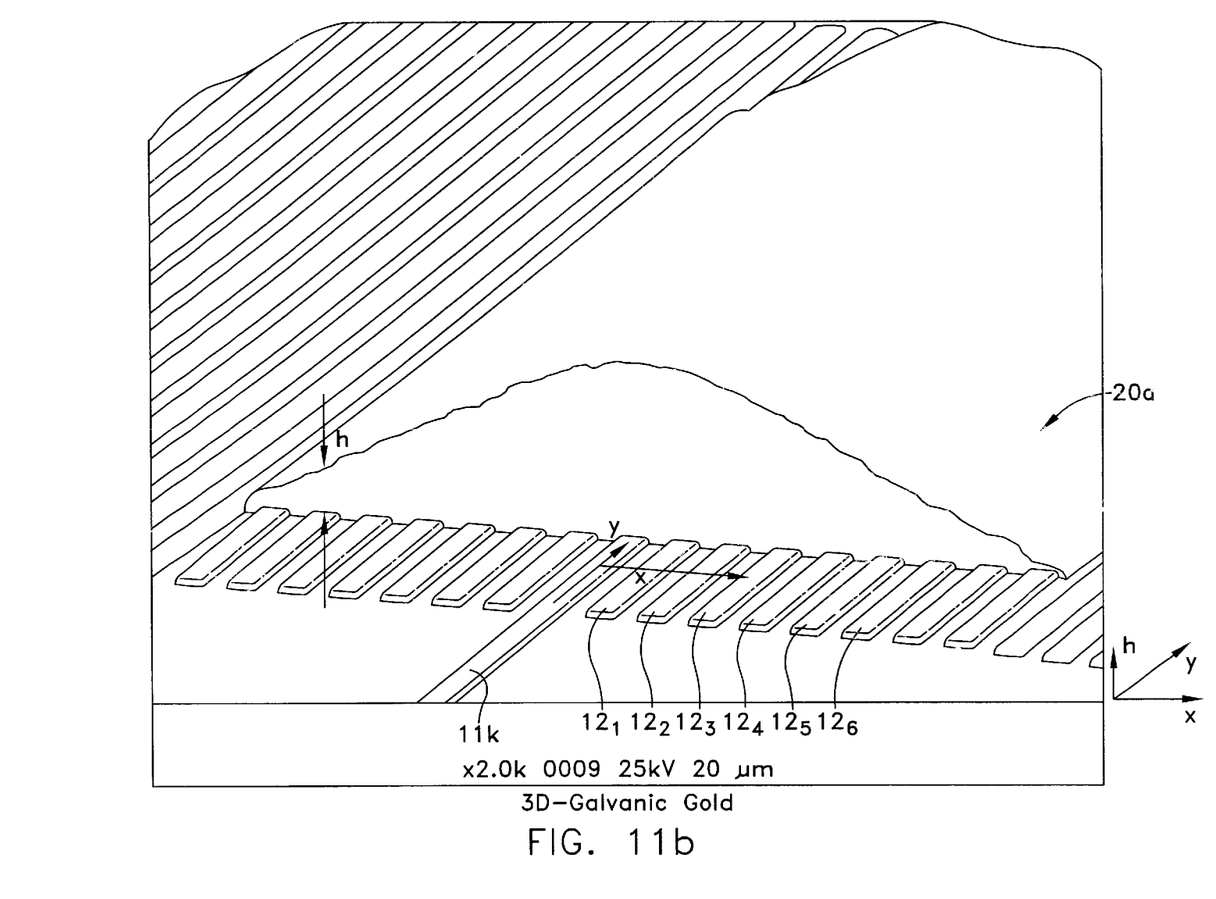

FIGS. 11a and 11b show galvanic structures which were provided according to the described method by being limited on two sides with a resist structure. According to said Figures, a hill-shaped galvanic structure 20' and 20a, respectively, having two bevelled surfaces and a summit is formed, the zenith lying above said cathodic stripe 11k which corresponds to the stripe 11k' of FIG. 9 and FIG. 4. Metal stripes $12_1, 12_2, 12_3$, etc. are laterally spaced in relation to each other and isolated therefrom, as can also be seen from FIG. 9. The right edge zones of FIG. 11b give a particularly distinct impression of the step-wise over-galvanization with subsequent vertical galvanization, the bevelled surface still showing distinct traces of the stripe structure of which it is formed. The groove structure is leveled only in further upward areas providing a bevelled surface which is substantially even.

The inclination angle according to FIG. 10 is controlled by defining an interspace s according to FIG. 10a and a width I of the stripes. If other structures are selected, not being stripes, but concentrical or ellipsoid shapes, the function of FIG. 10 may differ correspondingly. In general, the inclination angle of the bevelled surface formed is defined such that a larger interspace s and a smaller width I of the stripes result in a larger inclination angle. If the interspaces s are not equal in x-direction, other structures than bevelled structures may be obtained, the angle of the bevelled surface then depending on the interspace with respect to the cathode area 11k'.

Figure 8A:
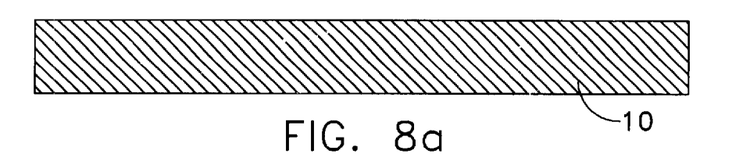
Figure 8B:
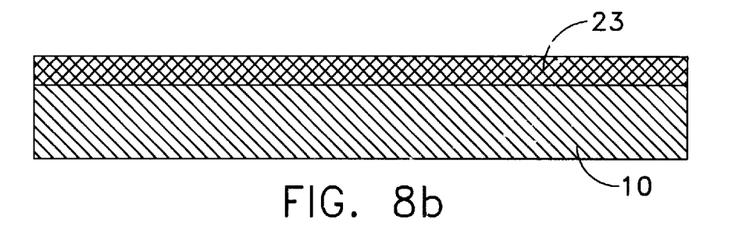
Figure 8C:
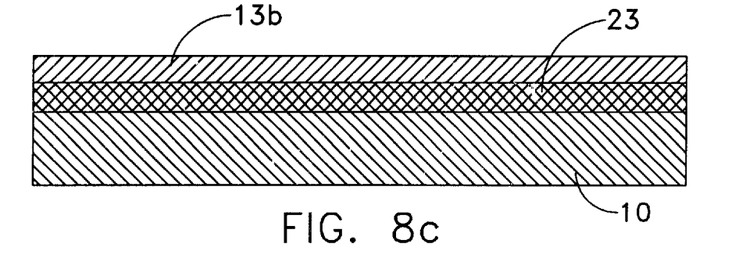
Figure 8D:
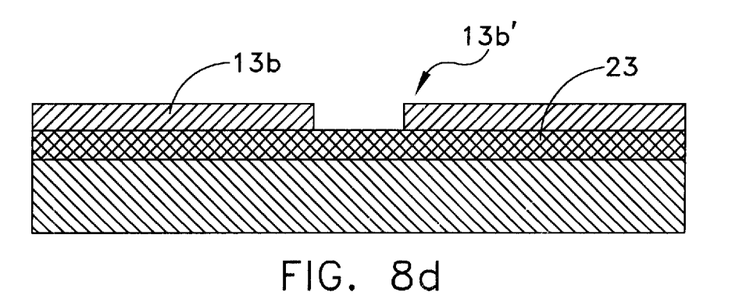
Figure 8E:
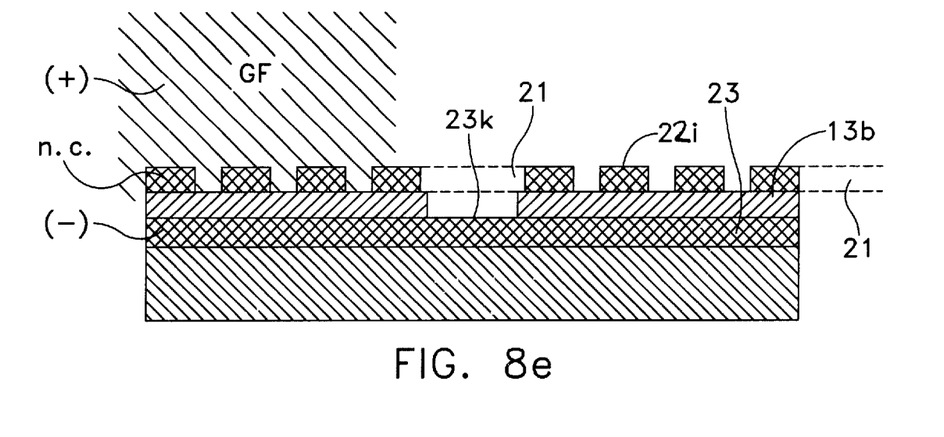

FIGS. 8a to 8e describe an alternative production method. Starting from a substrate 10, a first plating layer 23 is applied as conductive starting layer (FIG. 8b). An isolating layer 13b is applied on said conductive layer 23, e. g. by vaporization or sputtering. At an appropriate place in said isolating layer, a core area $23_k$ of said covered first conductive layer 23 is uncovered. The corresponding window is defined by reference numeral 13b'. An electric contact to the galvanic fluid may be provided here. Said covered conductive layer 23 serves as a lead-in or lead-out of electric current (FIG. 8d, FIG. 8e).

On said isolating layer 13b, island areas $22_i$ are formed, structured either before providing said window according to FIG. 8b or thereafter from a second plating layer (by coating with a resist and exposure to light). Said island areas are electrically isolated from said first conductive layer 23 (FIG. 8e).

If the intermediate product shown in FIG. 8e is used as a basis for galvanization, firstly depositions are formed at said window 13b' above said core area $23_k$, said depositions galvanizing over by surging to said first stripes being directly adjacent to said window 13b'. Starting from there, a solid three-dimensional deposited structure develops—e.g. according to FIG. 9—such that at the edges, no limitations by high or thick resist layers are provided. Thus, FIG. 8e is a basis for growth rates extending in all directions of the plane x/y and being controlled and influenced by the structure of said island areas $22_i$ above and isolated from said conductive layer 23 positioned inside.

In FIG. 8e, the electrical potentials (+) and (−) are indicated schematically which potentials are applied at the galvanic fluid GF and the conductive layer 23. The island areas $22_i$ are not connected (n.c.).

All embodiments of the methods as proposed by the present invention relate to structured surfaces. A structured surface develops from an expanded conductive layer having been applied by sputtering or vaporization, the kind of the metal used as a layer being subject to the selected (subsequent) galvanization. Subsequently, a coating with a thin, e. g. 1 $\mu$m structure resist layer is effected and the structure of the conductive layer may be obtained in a lithographic process by exposure and uncovering (etching or ion milling). Additionally, a galvanic pre-shaping step may be effected to provide a more stable structure. Also a metal of a small thickness of about 100 nm may additionally be sputtered.

What is claimed is:

1. A method for manufacturing a galvanically deposited metallic structure shaped in vertical direction on a substrate, wherein:
   (a) a conductive layer is deposited and laterally structured to provide a first area and a plurality of second areas having interspaces between them, the first and the plurality of second areas being conductive and isolated from one another, the first and the plurality of second areas being conductive and laterally separated by interspaces such that the first and second areas initially are insulated from one another;
   (b) a cathodic potential is applied to said first area exposed to a metal ion solution providing a source of a metallic substance for deposition, to start a galvanic deposition of the metallic substance on the substrate, the cathodic potential being relative to the source of the metallic substance for deposition;
   (c) further comprising continuing said galvanic deposition, causing deposition of the metallic substance to extend over the interspaces adjacent to said first area, eventually contacting and applying said cathodic potential to at least one of said second areas, whereby said deposition applies respectively to said first area and said at least one of said second areas for different times, and at least one 3-D-solid structure of the metallic substance is deposited, having one of bevelled and sloping surfaces on the substrate.

2. The method of claim 1, wherein said structure is provided by shaping a core area and island areas spaced apart from the core area, which island areas are isolated in relation to said core area and substantially isolated in relation to each other.

3. The method of claim 2, wherein during said galvanic deposition, said core and island areas have different potentials and are initially insulated.

4. The method of claim 1, wherein said lateral structure is provided by applying a thin coating of a photosensitive resist on a conductive layer and laterally structuring it in a lithographic process to form said first and second areas.

5. The method of claim 4, wherein said structured resist coating is one of
   (a) subjected to a galvanic deposition; and
   (b) provided with a metal coating to provide a second structured surface; for providing conductive areas spaced apart with respect to each other.

6. The method of claim 5 wherein said structured resist coating is applied by an application technique selected from the group consisting of sputtering, vapor-plating, and vaporizing.

7. The method of claim 2, wherein a thick resist layer is applied on the structured conductive layer, which resist layer is exposed to a light and uncovered and at least a part of said core area is uncovered as well.

8. The method of claim 2, wherein said core area is positioned at a lower level than said island areas and said first and second areas are separated from each other by an insulating layer.

9. The method of claim 8, wherein said core area positioned at a lower level is an uncovered area of a second conductive layer forming a plating base applied on said substrate before said first conductive layer.

10. The method of claim 9, wherein said second conductive layer is isolated with respect to said first conductive layer after structuring.

11. The method of claim 1, wherein after forming said 3-D solid structure, a non-laterally structured part of the deposited layer is removed from the substrate.

12. The method of claim 11 wherein areas of said structured resist layer are removed before said deposition.

13. The method of claim 1, the height of the galvanically deposited structure being of a size of 1 $\mu$m to 100 $\mu$m.

14. The method of claim 13 wherein said size is below 10 $\mu$m.

15. The method of claim 1, said metallic structure being a bevelled structure.

16. The method of claim 1, wherein an isolating layer comprising SiN is applied between said substrate and said first and second areas.

17. The method of claim 1, further comprising adjusting the shape of said galvanically deposited structure by setting at least one of the interspace, the width and the geometry of said island areas in relation to said core area.

18. The method of claim 1, wherein said thick resist layer is substantially thicker than 1 $\mu$m and said thin resist layer is of a size of 1 $\mu$m.

19. A method for manufacturing a three-dimensionally formed metallic profile having substantial variations in thickness defining at least one flank for micromechanic use, comprising:
   (a) applying at least one conductive layer on a substrate;
   (b) laterally structuring said at least one conductive layer to provide a core area and a plurality of laterally spaced, electrically isolated island areas, each having a first and a second extension in lateral direction, said first extension being substantially longer than said second extension;
   (c) starting a galvanization for a galvanic deposition of a metallic substance at said core area, by applying a cathodic potential to said core area other than said electrically isolated island areas initially being electrically unconnected from the core area and from the cathodic potential, the cathodic potential being relative to a source of the metallic substance for deposition;
   (d) continuing galvanic deposition of the metallic substance along a direction corresponding to said second extension and permitting the metallic substance to expand into contact with at least one of said island areas previously electrically unconnected from the core area, thereby forming a predetermined metallic profile with said substantial variations in thickness along said direction and forming said at least one flank for micromechanic use.

20. The manufacturing method of claim 19, comprising applying two conductive layers on said substrate, substantially isolated from each other, and wherein the first of the conductive layers which was applied first is providing a cathode electrode in contact with a galvanic fluid, and the second layer having been structured to provide said island areas, initially electrically isolated from said cathode electrode.

21. The manufacturing method of claim 19, wherein said formed metallic profile varies substantially continuously in thickness, in at least one of two parallel directions, corresponding with said second extension.

22. The manufacturing method of claim 19, wherein prior to galvanization, said core area of said plating base which is not laterally structured, is coated with a resist shape by coating substantially the entire area with a resist layer and removing a portion of said resist layer from the structured portion of said conductive layer.

23. The manufacturing method of claim 19, wherein said three-dimensionally shapable metallic structure is provided with at least one bevelled surface extending in a ramp-related manner from said substrate to a higher level portion of a resist layer applied on a non-structured portion of said conductive layer plating base.

24. The method of claim 19, wherein the substantial variations are one of sinusoidal, cosinusoidal, an e-function and a 1-e-function.

25. The method of claim 19, wherein said metallic profile is deposited on said substrate by a galvanic process, with lateral control of a growth rate by selecting an interspace and second extension of at least one of said island areas that is initially one of electrically unconnected and poorly connected to the core area.

26. The method of claim 25, wherein the control of the growth rate provides a faster vertical growth rate than said lateral control of the growth rate.

27. The method of claim 19, a blocking means being provided at least for one direction, except a direction corresponding to said second extension, for defining a substantially vertical flank at said blocking means.

28. The method of claim 27, the blocking means blocking the continuing galvanic deposition and expansion in at most three lateral directions.

* * * * *